United States Patent
Wu et al.

(10) Patent No.: US 7,736,939 B2
(45) Date of Patent: Jun. 15, 2010

(54) METHOD FOR FORMING MICROLENSES OF DIFFERENT CURVATURES AND FABRICATING PROCESS OF SOLID-STATE IMAGE SENSOR

(75) Inventors: Hsin-Ping Wu, Yilan County (TW); Chia-Huei Lin, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 1369 days.

(21) Appl. No.: 11/160,739

(22) Filed: Jul. 7, 2005

(65) Prior Publication Data
US 2007/0008421 A1    Jan. 11, 2007

(51) Int. Cl.
*H01L 21/00* (2006.01)

(52) U.S. Cl. ............... 438/71; 438/29; 438/39; 438/60; 438/75; 257/E27.135; 257/E31.121

(58) Field of Classification Search .......... 438/29, 438/39, 60, 70, 71, 75, 587; 257/E27.135, 257/E31.121
See application file for complete search history.

(56) References Cited

U.S. PATENT DOCUMENTS

| | | | |
|---|---|---|---|
| 4,904,569 A * | 2/1990 | Fukuda et al. | 430/311 |
| 5,534,720 A * | 7/1996 | Song et al. | 257/232 |
| 5,922,223 A | 7/1999 | Okumura et al. | 219/121.43 |
| 6,379,992 B2 | 4/2002 | Jo | 438/70 |
| 6,643,386 B1 | 11/2003 | Foster | 382/100 |
| 7,535,509 B2 * | 5/2009 | Takayama | 348/340 |
| 2005/0105188 A1 * | 5/2005 | Hayashi et al. | 359/619 |

\* cited by examiner

*Primary Examiner*—Thanh V Pham
(74) *Attorney, Agent, or Firm*—Chun-Ming Shih

(57) ABSTRACT

A method for forming microlenses of different curvatures is described, wherein a substrate having at least a first and a second areas different in height is provided. A transparent photosensitive layer having a planar surface is formed on the substrate and then patterned into at least two islands of different thicknesses respectively over the first area and the second area. The at least two islands are heated and softened to form at least two microlenses of different curvatures respectively over the first area and the second area, wherein the higher an area is, the smaller the curvature of the corresponding microlens is.

10 Claims, 3 Drawing Sheets

METHOD FOR FORMING MICROLENSES OF DIFFERENT CURVATURES AND FABRICATING PROCESS OF SOLID-STATE IMAGE SENSOR

BACKGROUND OF THE INVENTION

1. Field of the Invention

The present invention relates to a method for fabricating optical components. More particularly, the present invention relates to a method for forming microlenses of different curvatures, and to a fabricating process of a solid-state image sensor which utilizes the method so that the sensitivities to different color lights can be optimized respectively.

2. Description of the Related Art

A solid-state image sensor, such as a CCD image sensor or CMOS image sensor (CIS), is essentially composed of red, green and blue pixel sensors that are respectively equipped with red, green and blue filters. To increase the quantum yield of incident light for improving the sensitivity, a microlens can be formed over each color filter to focus the incident light, as described in U.S. Pat. No. 6,379,992, for example.

Referring to FIG. 1A, in a typical microlens process of a CIS device, a substrate 100 is provided, on which a passivation layer 110 for protecting the circuit of the sensor, blue, green and red filters 120, 130 and 140, and a planarization layer 150 have been formed. A transparent photosensitive layer 160 is formed on the planarization layer 150 and then patterned into islands 160a of the same thickness, wherein each island 160a is form over one color filter.

Referring to FIG. 1B, the islands 160a are heated and softened such that the surface tension makes their surfaces spherical, thus forming multiple microlenses 160b, which have the same curvatures because all of the islands 160a have the same thickness. Hence, the focal lengths of the three microlenses 160b over the blue, green and red filters 120-140 are the same.

However, as shown in FIG. 1B, because respective maximal absorption regions 122, 132 and 142 of blue, green and red lights 124, 134 and 144 are different in depth in the substrate 100, the absorptions of the blue, green and red lights cannot be optimized respectively with the microlenses 160b of the same curvature that have a single focal length only. Hence, the sensitivities of the image sensor to different color lights are different to cause chromatic deviation of the recorded images.

To solve the above problem, for example, the method disclosed in U.S. Pat. No. 5,592,223 can be used, in which the sensitivities to different color lights are equalized by varying respective areas and/or curvatures of the microlenses formed over different color filters. Besides, the method provided in U.S. Pat. No. 6,643,386 equalizes the sensitivities to different color lights by altering respective colors or shapes of the microlenses over different color filters, wherein the shapes include areas and curvatures.

However, when the sensitivities are equalized by forming microlenses of different areas or colors, a color light of higher sensitivity is made to have a lowered intensity incident to the corresponding sensor diode. Therefore, the overall sensitivity of the CIS device cannot be improved. In addition, forming microlenses of different colors needs more than one lithography processes, so that the fabrication is tedious.

On the other hand, when the sensitivities are equalized by forming microlenses of different curvatures, the sensitivities to different color lights can be respectively optimized by adjusting respective curvatures to obtain different focal lengths. However, this microlens process is very tedious because three lithography processes are conducted to form photoresist islands of three thicknesses for making the three curvatures.

SUMMARY OF THE INVENTION

In view of the foregoing, one object of this invention is to provide a method for forming microlenses of different curvatures, by which the sensitivities of a solid-state image sensor to different color lights can be optimized respectively.

Another object of this invention is to provide a fabricating process of a solid-state image sensor, which utilizes the above method of this invention to respectively optimize the sensitivities to different color lights.

The method for forming microlenses of different curvatures of this invention is described as follows. A substrate having at least a first and a second areas different in height is provided, and then a transparent photosensitive layer having a planar surface is formed on the substrate. The photosensitive layer is patterned into at least two islands respectively over the first area and the second area, wherein the higher an area is, the smaller the thickness of the corresponding island is. Then, the at least two islands are heated and softened to form at least two microlenses of different curvatures respectively over the first area and the second area.

In the above method, when the height of an area is larger, the thickness of the corresponding island is smaller, so that the curvature of the corresponding microlens is smaller and the focal length of the corresponding microlens is therefore larger.

In an embodiment of this invention, the above method is applied to a fabricating process of a solid-state image sensor, such as a CMOS image sensor. In the solid-state image sensor, the sensors of first to third color lights respectively have a first, a second and a third maximal absorption regions that are different in depth in the substrate. The substrate includes three areas of three different heights respectively over the first, the second and the third maximal absorption regions, wherein the three different heights may be caused by first to third color filters of the first to third color lights having different thicknesses on a planar surface.

Since the photosensitive layer is formed having a planar surface, three islands of three different thicknesses are defined capable of forming three microlenses of three different curvatures respectively over the first, the second and the third maximal absorption regions. The three areas of three different heights are arranged in a manner that the deeper a maximal absorption region is, the higher the corresponding area is, such that the three microlenses are formed with three different curvatures/focal lengths capable of focusing the first to third color lights respectively to the first, the second and the third maximal absorption regions.

Accordingly, in the method for fabricating a solid-state image sensor of this invention, the first to third color filters of the first to third color lights are formed on a planar surface and in three different thicknesses to form three areas different in height, and then the above method for forming three microlenses of three different curvatures is applied without a planarization layer being formed previously. The planar upper surface of the substrate may be the upper surface of a passivation layer that protects the circuit of the solid-state image sensor. The three different thicknesses of the first to third color filters are controlled such that the three microlenses are formed with three different curvatures capable of focusing the first to third color lights respectively to the first, the second and the third maximal absorption regions.

Since the microlenses of different curvatures are form with only one lithography process via the variation of local heights of the substrate surface, much process time is saved as compared with the prior art that forms microlenses different in color or curvature with more than one lithography processes. Meanwhile, because the first to third color lights are focused respectively to the first, second and third maximal absorption regions, the sensitivities of the sensor to the first to third color lights are optimized respectively. Therefore, the overall sensitivity of the solid-state image sensor can be improved as compared with the prior art that forms microlenses different in area or color.

It is to be understood that both the foregoing general description and the following detailed description are exemplary, and are intended to provide further explanation of the invention as claimed.

DESCRIPTION OF THE PREFERRED EMBODIMENTS

Figure 1A:
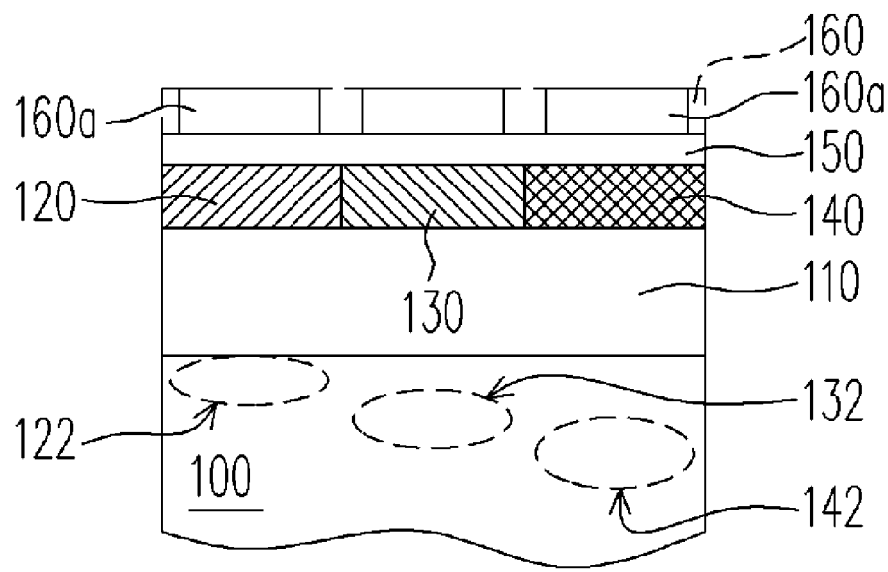
FIGS. 1A-1B illustrate a process flow of fabricating a CMOS image sensor in the prior art in a cross-sectional view, including a process of forming microlenses.
Figure 1B:
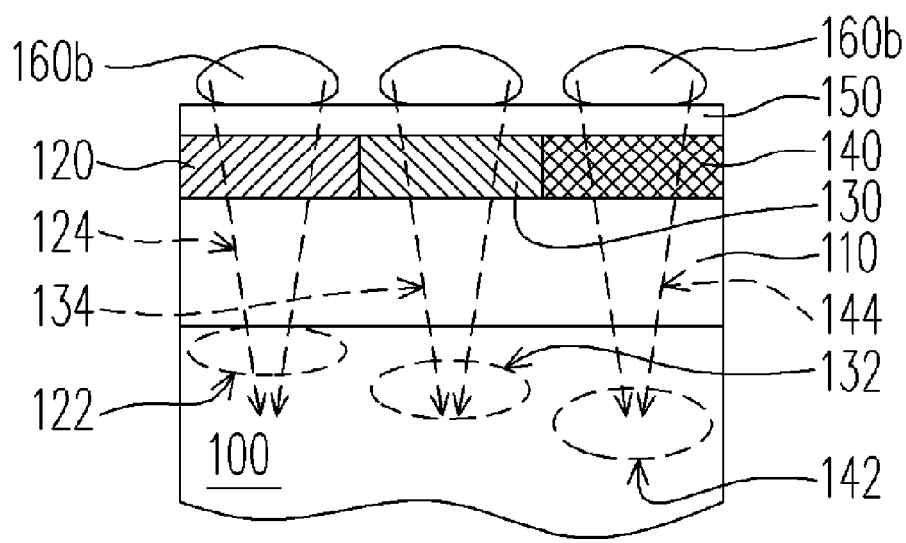
Figure 2A:
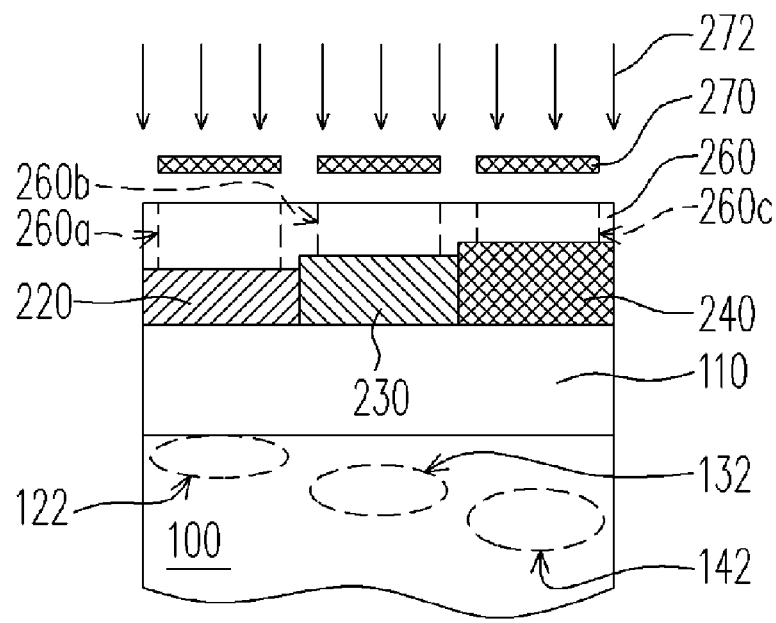
FIGS. 2A-2C illustrate a process flow of fabricating a CMOS image sensor (CIS) according to a preferred embodiment of this invention in a cross-sectional view, which includes a process of forming microlenses of different curvatures.
Figure 2B:
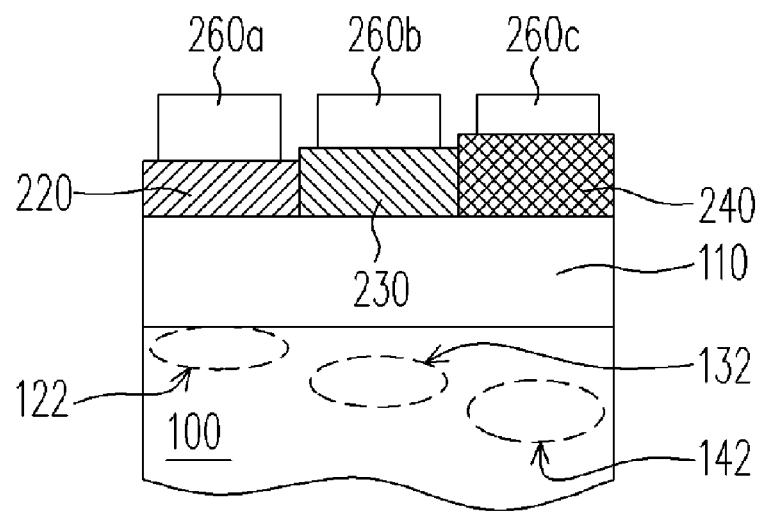
Figure 2C:
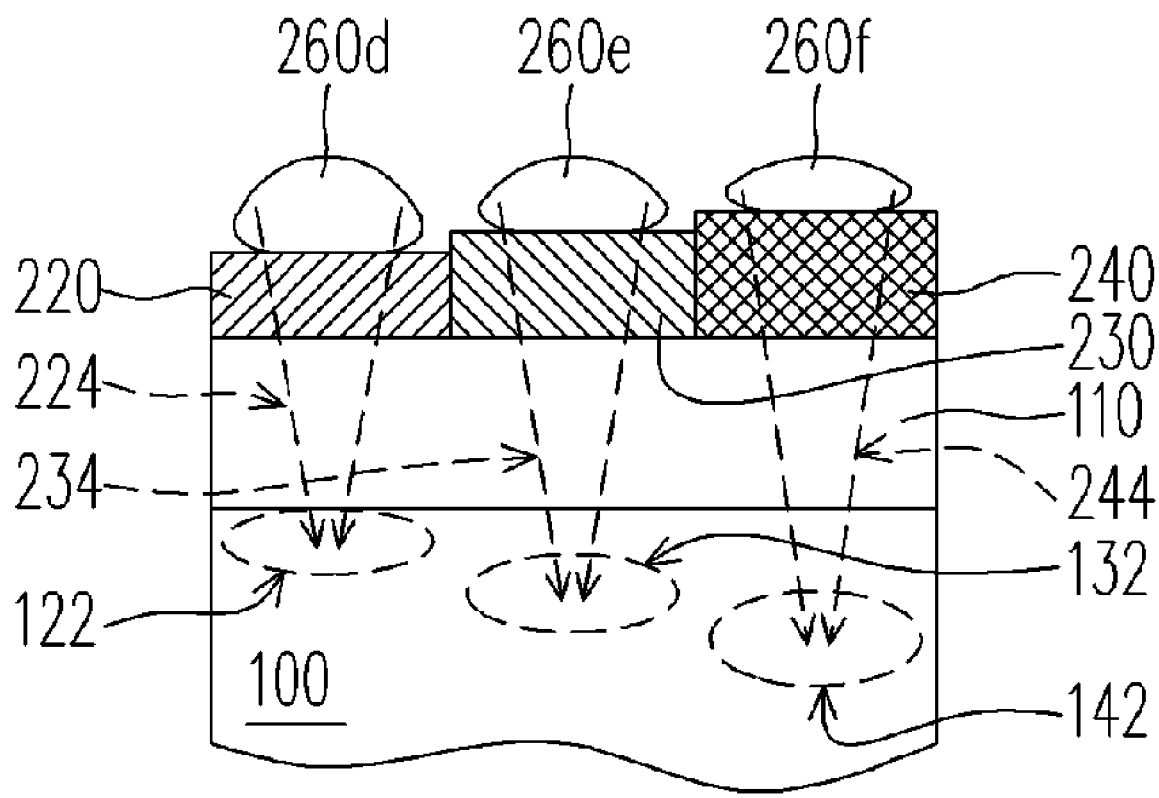

This invention will be further explained with a fabricating process of a CMOS image sensor as a preferred embodiment, which is illustrated in FIGS. 2A-2C in a cross-sectional view. In this embodiment, the first to third color lights as mentioned above are red light, green light and blue light, respectively, but are not limited to those. The three color lights may alternatively be magenta, cyan and yellow lights, or any other combination of three color lights that can be combined to obtain full colors.

Referring to FIG. 2A, a semiconductor substrate 100 is provided, having been formed with a circuit (not shown) thereon, which essentially includes CMOS transistors, sensor diodes and necessary interconnect structures, etc. The depths D1, D2 and D3 of the maximal absorption regions 142, 132 and 122 of red, green and blue lights in the substrate 100 satisfy the inequality of "D1>D2>D3". Then, a passivation layer 110, such as a thick SiO2 layer, is formed over the substrate 100 covering and protecting the circuit. It is noted that since one skilled in the art can easily find a circuit of CMOS image sensor in many references and the circuit is no feature of this invention, the circuit is not depicted in the figures. In addition, the photosensing regions of the three color lights are depicted contiguously in FIGS. 2A-2C for simplification.

After that, a blue filter 220, a green filter 230 and a red filter 240 different from each other in thickness are respectively formed on the planar surface of the passivation layer 110, wherein the red filter 240 is thicker than the green filter 230 that is thicker than the blue filter 220. Each of the blue, green and red filters 220, 230 and 240 can be defined from a colored photosensitive layer, such as a colored photoresist layer, with a corresponding thickness, so that three lithography processes are required to complete the filter fabrication. Thereafter, microlenses can be formed directly on the color filters 220-240, without a planarization layer being formed previously.

Referring to FIGS. 2A-2B, a transparent photosensitive layer 260 having a planar surface is formed covering the color filters 220-240, and then a lithography process using a photomask 270 and exposure light 272 is performed to pattern the transparent photosensitive layer 260 into islands 260a, 260b and 260c, which will be converted to microlenses later. The transparent photosensitive layer 260 is a layer transparent to visible light but not to the UV light used in the lithography process, and may include a positive photoresist material. Since the red filter 240 is thicker than the green filter 230 that is thicker than blue filter 220 as well as the photosensitive layer 260 has a planar surface, the island 260c over the red filter 140 is thinner than the island 260b over the green filter 130, and the island 260b over the green filter 130 is thinner than the island 260a over the blue filter 120.

Referring to FIG. 2C, the islands 260a, 260b and 260c are then heated and softened to form microlenses 260d, 260e and 260f, respectively, via the surface tension effect, wherein the thicker an island is, the larger the curvature of the corresponding microlens is. Since the island 260a is thicker than the island 260b and 260b thicker than 260c, respective curvatures C1, C2 and C3 of the microlenses 260d, 260e and 260f satisfy the inequality of "C1>C2>C3", so that respective focal lengths L1, L2 and L3 of the three microlens 260f, 260e and 260d satisfy the inequality of "L1>L2>L3". Since respective depths D1, D2 and D3 of the maximal absorption regions 142, 132 and 122 satisfy the inequality of "D1>D2>D3", by adjusting the thicknesses of the color filters 220-240 carefully, the microlenses 260d, 260e and 260f can be formed such that blue light 224, green light 234 and red light 244 are focused to the maximal absorption regions 122, 132 and 142, respectively.

According to the above preferred embodiment of this invention, since the microlenses of different curvatures respectively for red light, green light and blue light are form with only one lithography process via the variation of local heights of the substrate surface, much process time is saved as compared with the prior art that forms microlenses of three curvatures with three lithography processes. Meanwhile, since each of the blue, green and red lights are focused to the corresponding maximal absorption region, the sensitivities to the red, green and blue lights are optimized respectively. Therefore, the overall sensitivity of the solid-state image sensor can be improved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming microlenses of different curvatures, comprising:

providing a substrate having at least a first and a second areas different in height;

forming a transparent photosensitive layer having a planar surface on the substrate;

patterning the photosensitive layer into at least two islands of different thicknesses respectively over the first area and the second area; and heating and softening the at least two islands to form at least two microlenses of different curvatures respectively over the first and the second areas, wherein the higher an area is, the smaller the curvature of the corresponding microlens is.

2. The method of claim 1, which is applied to a fabricating process of a solid-state image sensor that includes first to third pixel sensors respectively sensing a first, a second and a third color lights and respectively having a first, a second and a third maximal absorption regions different in depth in the substrate, wherein the first to third color lights can be combined to obtain full colors; and the substrate has three areas of three different heights respectively over the first, the second and the third maximal absorption regions, such that three islands of three different thicknesses are defined to form three microlenses of three different curvatures respectively over the first, the second and the third maximal absorption regions, wherein the deeper a maximal absorption region is, the higher the corresponding area is, such that the three microlenses are formed with three different curvatures capable of focusing the first to third color lights respectively to the first, the second and the third maximal absorption regions.

3. The method of claim 2, wherein the three areas of three different heights are caused by three color filters of the first to third color lights that have three different thicknesses on a planar surface.

4. The method of claim 2, wherein the first to third color lights are red light, green light and blue light, respectively.

5. The method of claim 4, wherein the solid-state image sensor comprises a CMOS image sensor;

the first to third maximal absorption regions are respectively at depths D1, D2 and D3 in the substrate satisfying an inequality of "D1>D2>D3";

the three microlenses includes a first, a second and a third microlenses respectively having curvatures C1, C2 and C3 satisfying an inequality of "C1>C2>C3"; and the first, the second and the third microlenses are respectively formed over the third, the second and the first maximal absorption regions of the blue light, the green light and the red light, respectively.

6. A method for fabricating a solid-state image sensor that includes pixel sensors of first to third color lights that can be combined to obtain full colors, comprising:

providing a substrate having a planar upper surface, wherein first to third maximal absorption regions of the first to third color lights are different in depth in the substrate;

forming first to third color filters of the first to third color lights respectively over the first, the second and the third maximal absorption regions, wherein the first to third color filters are different from each other in thickness;

forming a transparent photosensitive layer having a planar surface on the substrate;

patterning the photosensitive layer into three islands of three different thickness respectively over the first, the second and the third color filters; and heating and softening the three islands to form three microlenses of three different curvatures respectively over the first, the second and the third color filters, wherein the color filters are formed in a manner that the deeper a maximal absorption region is, the thicker the corresponding color filter is, such that the three microlenses are formed with three different curvatures capable of focusing the first to third color lights respectively to the first, the second and the third maximal absorption regions.

7. The method of claim 6, wherein the first to third color lights are red light, green light and blue light, respectively.

8. The method of claim 7, wherein the solid-state image sensor comprises a CMOS image sensor;

the first color filter is thicker than the second color filter and the second color filter thicker than the third color filter;

the first to third maximal absorption regions are respectively at depths D1, D2 and D3 in the substrate satisfying an inequality of "D1>D2>D3";

the three microlenses includes a first, a second and a third microlenses respectively having curvatures C1, C2 and C3 satisfying an inequality of "C1>C2>C3"; and the first, the second and the third microlenses are respectively formed over the third, the second and the first maximal absorption regions of the blue light, the green light and the red light, respectively.

9. The method of claim 6, wherein the planar upper surface of the substrate is an upper surface of a passivation layer.

10. The method of claim 9, wherein the passivation layer comprises SiO2.

* * * * *